(12) United States Patent
Feustel et al.

(10) Patent No.: US 8,173,538 B2
(45) Date of Patent: May 8, 2012

(54) METHOD OF SELECTIVELY FORMING A CONDUCTIVE BARRIER LAYER BY ALD

(75) Inventors: Frank Feustel, Dresden (DE); Carsten Peters, Dresden (DE); Thomas Foltyn, Zwickan (DE)

(73) Assignee: Advanced Micro Devices, Inc., Austin, TX (US)

( * ) Notice: Subject to any disclaimer, the term of this patent is extended or adjusted under 35 U.S.C. 154(b) by 286 days.

(21) Appl. No.: 11/757,022

(22) Filed: Jun. 1, 2007

(65) Prior Publication Data

US 2008/0132057 A1    Jun. 5, 2008

(30) Foreign Application Priority Data

Nov. 30, 2006  (DE) .................. 10 2006 056 626

(51) Int. Cl.
*H01L 21/4763* (2006.01)
(52) U.S. Cl. ............. 438/622; 438/644; 257/E21.584
(58) Field of Classification Search .......... 438/576, 438/641; 257/E21.536
See application file for complete search history.

(56) References Cited

U.S. PATENT DOCUMENTS

| | | | |
|---|---|---|---|
| 5,904,565 A * | 5/1999 | Nguyen et al. ........... | 438/687 |
| 6,184,128 B1 * | 2/2001 | Wang et al. ............. | 438/637 |
| 6,204,204 B1 * | 3/2001 | Paranjpe et al. .......... | 438/785 |
| 6,294,458 B1 * | 9/2001 | Zhang et al. ............ | 438/627 |
| 6,300,219 B1 * | 10/2001 | Doan et al. ............. | 438/424 |
| 6,391,785 B1 * | 5/2002 | Satta et al. ............. | 438/704 |
| 6,426,289 B1 * | 7/2002 | Farrar .................. | 438/670 |
| 6,492,263 B1 * | 12/2002 | Peng et al. ............. | 438/639 |
| 6,509,267 B1 * | 1/2003 | Woo et al. .............. | 438/687 |
| 6,531,390 B2 * | 3/2003 | Chooi et al. ............ | 438/637 |
| 6,531,780 B1 * | 3/2003 | Woo et al. .............. | 257/758 |
| 6,541,842 B2 * | 4/2003 | Meynen et al. .......... | 257/632 |
| 6,664,192 B2 * | 12/2003 | Satta et al. ............. | 438/704 |
| 6,706,568 B2 * | 3/2004 | Nakajima ............... | 438/149 |
| 6,723,635 B1 * | 4/2004 | Ngo et al. .............. | 438/627 |
| 6,784,139 B1 * | 8/2004 | Sankar et al. ........... | 505/237 |
| 6,841,468 B2 * | 1/2005 | Friedemann et al. ...... | 438/627 |
| 6,852,635 B2 * | 2/2005 | Satta et al. ............. | 438/704 |
| 6,919,636 B1 * | 7/2005 | Ryan ................... | 257/751 |
| 6,953,742 B2 * | 10/2005 | Chen et al. ............. | 438/622 |
| 6,974,768 B1 * | 12/2005 | Kailasam ............... | 438/625 |
| 7,250,370 B2 * | 7/2007 | Chang et al. ........... | 438/694 |
| 7,429,401 B2 * | 9/2008 | Josell et al. ............ | 427/98.1 |
| 7,625,820 B1 * | 12/2009 | Papasouliotis et al. .... | 438/677 |
| 2002/0064941 A1 * | 5/2002 | Chooi et al. ............ | 438/633 |
| 2002/0117399 A1 * | 8/2002 | Chen et al. ............. | 205/125 |
| 2004/0137714 A1 * | 7/2004 | Friedemann et al. ...... | 438/627 |
| 2004/0147117 A1 * | 7/2004 | Ngo et al. .............. | 438/687 |
| 2004/0209460 A1 * | 10/2004 | Xi et al. ............... | 438/643 |
| 2004/0238961 A1 * | 12/2004 | Cunningham ........... | 257/758 |
| 2006/0019485 A1 * | 1/2006 | Komai et al. ........... | 438/627 |
| 2006/0024953 A1 * | 2/2006 | Papa Rao et al. ........ | 438/629 |
| 2006/0027925 A1 * | 2/2006 | Huang et al. ........... | 257/751 |

(Continued)

*Primary Examiner* — Cheung Lee

(74) *Attorney, Agent, or Firm* — Williams, Morgan & Amerson, P.C.

(57) ABSTRACT

By providing a surface modification process prior to or during a self-limiting deposition process, the per se highly conformal deposition behavior may be selectively changed so as to obtain reliable coverage at specific surface areas, while significantly reducing or suppressing a deposition above unwanted surface areas, such as the bottom of a via in advanced metallization structures of highly scaled semiconductor devices.

11 Claims, 9 Drawing Sheets

U.S. PATENT DOCUMENTS

| | | | |
|---|---|---|---|
| 2006/0121733 A1* | 6/2006 | Kilpela et al. | 438/681 |
| 2006/0157771 A1* | 7/2006 | Choi et al. | 257/306 |
| 2006/0199386 A1* | 9/2006 | Huang et al. | 438/687 |
| 2006/0251801 A1* | 11/2006 | Weidman et al. | 427/99.5 |
| 2006/0251872 A1* | 11/2006 | Wang et al. | 428/209 |
| 2007/0224801 A1* | 9/2007 | Yang et al. | 438/618 |
| 2007/0238288 A1* | 10/2007 | Suzuki | 438/652 |
| 2008/0061442 A1* | 3/2008 | Ko et al. | 257/774 |

\* cited by examiner

METHOD OF SELECTIVELY FORMING A CONDUCTIVE BARRIER LAYER BY ALD

BACKGROUND OF THE INVENTION

1. Field of the Invention

The present disclosure generally relates to the field of fabrication of integrated circuits, and, more particularly, to manufacturing an interconnect structure requiring a barrier layer formed between a bulk metal and a dielectric, wherein the barrier layer is at least partially formed by self-limiting deposition techniques, such as atomic layer deposition (ALD).

2. Description of the Related Art

In a complex integrated circuit, a very large number of circuit elements, such as transistors, capacitors, resistors and the like, are formed in or on an appropriate substrate, usually in a substantially planar configuration. Due to the large number of circuit elements and the required complex layout of the integrated circuits, generally the electrical connection of the individual circuit elements may not be established within the same level on which the circuit elements are manufactured, but requires one or more additional "wiring" layers, also referred to as metallization layers. These metallization layers generally include metal lines, providing the inner-level electrical connection, and also include a plurality of inter-level connections, also referred to as vias, wherein the metal lines and vias may also be commonly referred to as interconnect structures.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers increases as the number of circuit elements per chip area becomes larger. Since the fabrication of a plurality of metallization layers entails extremely challenging issues to be solved, such as mechanical, thermal and electrical reliability of many stacked metallization layers that are required, for example, for sophisticated microprocessors, semiconductor manufacturers are increasingly using a metal that allows high current densities and hence allows reducing dimensions of the interconnections. For example, copper is a metal generally considered to be a viable candidate due to its superior characteristics in view of higher resistance against electromigration and significantly lower electrical resistivity when compared with other metals, such as aluminum, that have been used over the last decades. In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures due to its lack of forming volatile etch byproducts. In manufacturing metallization layers including copper, the so-called damascene technique is therefore preferably used wherein a dielectric layer is first applied and then patterned to receive trenches and vias, which are subsequently filled with copper. A further major drawback of copper is its property to readily diffuse in low-k dielectric materials, silicon and silicon dioxide, which is a well-established and approved dielectric material in fabricating integrated circuits.

It is therefore necessary to employ a so-called barrier material in combination with a copper-based metallization to substantially avoid any out-diffusion of copper into the surrounding dielectric material, as copper may readily migrate to sensitive semiconductor areas, thereby significantly changing the characteristics thereof. On the other hand, the barrier material may suppress the diffusion of reactive components into the metal region. The barrier material provided between the copper and the dielectric material should exhibit, however, in addition to the required barrier characteristics, good adhesion to the dielectric material as well as to the copper and should also have as low an electrical resistance as possible so as to not unduly compromise the electrical properties of the interconnect structure. It turns out, however, that a single material may not readily meet the requirements imposed on a desired barrier material. Hence, a mixture of materials may be frequently used to provide the desired barrier characteristics. For instance, a bi-layer comprised of tantalum and tantalum nitride is often used as a barrier material in combination with a copper damascene metallization layer. Tantalum, which effectively blocks copper atoms from diffusing into an adjacent material even when provided in extremely thin layers, however, exhibits only a poor adhesion to a plurality of dielectric materials, such as silicon dioxide based dielectrics, so that a copper interconnection including a tantalum barrier layer may suffer from reduced mechanical stability especially during the chemical mechanical polishing of the metallization layer, which is required for removing excess copper and planarizing the surface for the provision of a further metallization layer. The reduced mechanical stability during the CMP process may, however, entail several reliability concerns in view of reduced thermal and electrical conductivity of the interconnections. On the other hand, tantalum nitride exhibits excellent adhesion to silicon dioxide based dielectrics, but has very poor adhesion to copper. Consequently, in advanced integrated circuits having a copper-based metallization, typically a barrier bi-layer of tantalum nitride/tantalum is used.

Due to the demand for a low resistance of the interconnect structure in combination with the continuous reduction of the dimensions of the circuit elements and associated therewith of the metal lines and vias, the thickness of the barrier layer has to be reduced, while nevertheless providing the required barrier effect. It has been recognized that tantalum nitride provides excellent barrier characteristics even if applied with a thickness of only a few nanometers and even less. Thus, sophisticated deposition techniques have been developed for forming thin tantalum nitride layers with high conformality even in high aspect ratio openings, such as the vias of advanced metallization structures. Corresponding deposition techniques have a substantially self-limiting deposition behavior and thus allow extremely thin layers to be deposited with a reliable coverage even at critical locations, such as the sidewall areas of vias and the like. Hence, respective self-limiting techniques, also referred to as atomic layer deposition (ALD), have been used for forming barrier layers of copper-based interconnect structures. Although these techniques represent a promising approach for further device scaling, there is still room for further improvements, as will be described in more detail with reference to FIGS. 1a-1c.

Figure 1A:
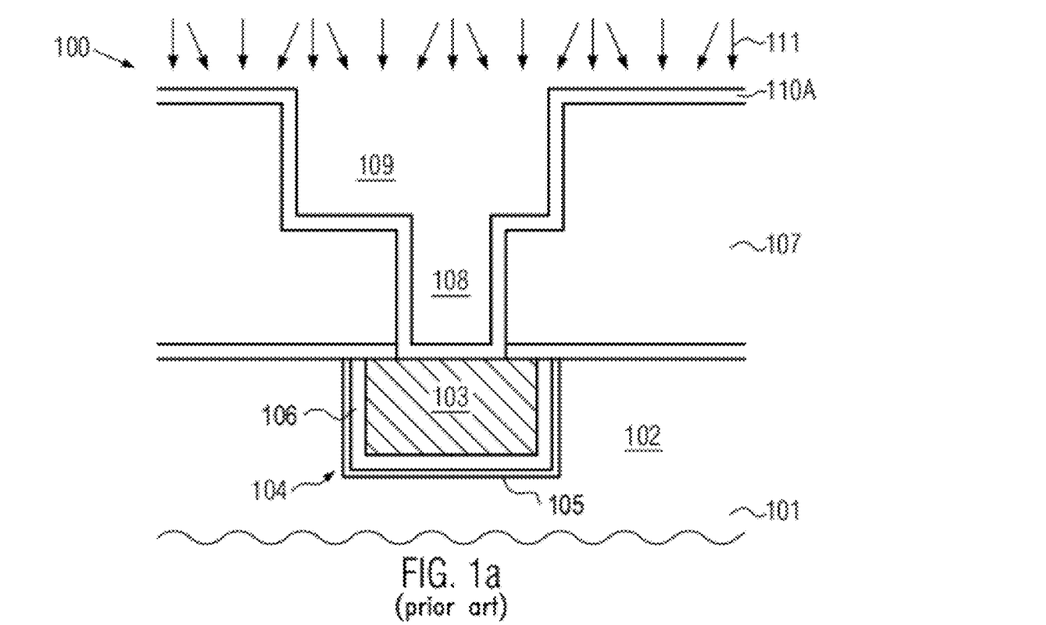
FIGS. 1a-1d schematically illustrate cross-sectional views of a conventional semiconductor device during the manufacturing of a metallization structure on the basis of a self-limiting deposition process for forming a tantalum nitride barrier layer, requiring an aggressive sputter etch process for removing the tantalum nitride material from unwanted areas according to a conventional technique.

In FIG. 1a, a metallization structure 100 comprises a substrate 101, for example, a semiconductor substrate, bearing a plurality of individual circuit elements (not shown), such as transistors, resistors, capacitors and the like. The substrate 101 is to represent any type of appropriate substrate with or without any additional circuit elements and may, in particular, represent sophisticated integrated circuit substrates having included therein circuit elements with critical feature sizes in the deep submicron regime. A first dielectric layer 102 is formed above the substrate 101 and includes a metal region 104 comprised of a metal line 103, such as a copper line, a first barrier layer 106 comprised of tantalum, and a second barrier layer 105 comprised of tantalum nitride. The dielectric layer 102, which may include an etch stop layer, in combination with the metal interconnection 104, may represent a first metallization layer. A second dielectric layer 107 comprised of silicon dioxide or a silicon dioxide based dielectric material or any other appropriate dielectric material is formed above the first dielectric layer 102 and has formed therein a trench 109 and a via 108 connecting to the metal line 103. A pre-form 110A of first barrier layer 110 is formed on exposed surface areas such as the inner surfaces of the via 108 and the trench 109.

A typical process flow for forming the metallization structure 100 as shown in FIG. 1a may include the following steps, wherein, for the sake of simplicity, only the formation of the second metallization layer, i.e., of the second dielectric layer 107 and the metal interconnection to be formed therein, will be described in detail as the processes in forming the metal interconnection 104 in the first dielectric layer 102 may substantially involve the same process steps. Thus, after planarizing the dielectric layer 102, including the metal interconnection 104, the etch stop layer may be deposited, followed by the deposition of the dielectric layer 107 by well-known deposition methods, such as plasma enhanced chemical vapor deposition (PECVD). Subsequently, the dielectric layer 107 is patterned by well-known photolithography and anisotropic etch techniques, wherein optionally an intermediate etch stop layer (not shown) may be used in patterning the trench 109. It should further be noted that different approaches may be employed in forming the trench 109 and the via 108, such as a so-called via first trench last approach, or a trench first via last approach, wherein, in the former approach, the via 108 may be filled with metal prior to the formation of the trench 109. In the present example, a so-called dual damascene technique is described in which the trench 109 and the via 108 are simultaneously filled with metal. After forming the via 108 and the trench 109, the pre-form 110A of the first barrier layer 110 is deposited by a self-limiting deposition process 111, in which, in a first step, appropriate gases are applied that may be obtained from, for instance, metal organic compounds, such as pentakis (dimethylamino) Ta (PDMAT). In other cases, the layer 110A may be formed on the basis of tantalum chloride, if the presence of chlorine may not negatively affect the reliability of the resulting interconnect structure. Generally, the deposition of the thin barrier layer 110, typically with a thickness in the range of approximately 1-15 nm or even less, in a reliable manner on the entire inner surfaces of the trench 109 and the via 108, wherein, in particular, the via 108 may have a large aspect ratio, may be accomplished on the basis of the ALD process 111. Generally, it is desirable to obtain a reliable coverage of the sidewalls of the trench 109 and the via 108 with a minimum thickness of the layer 110 so that only a minimum amount of space is "consumed" by the layer 110. Increasing the thickness of the barrier layer 110 would otherwise unduly compromise the electrical conductivity of the interconnection to be formed in the via 108 and the trench 109, especially when the feature sizes in the metallization level are scaled to 0.2 μm and less.

Figure 1B:
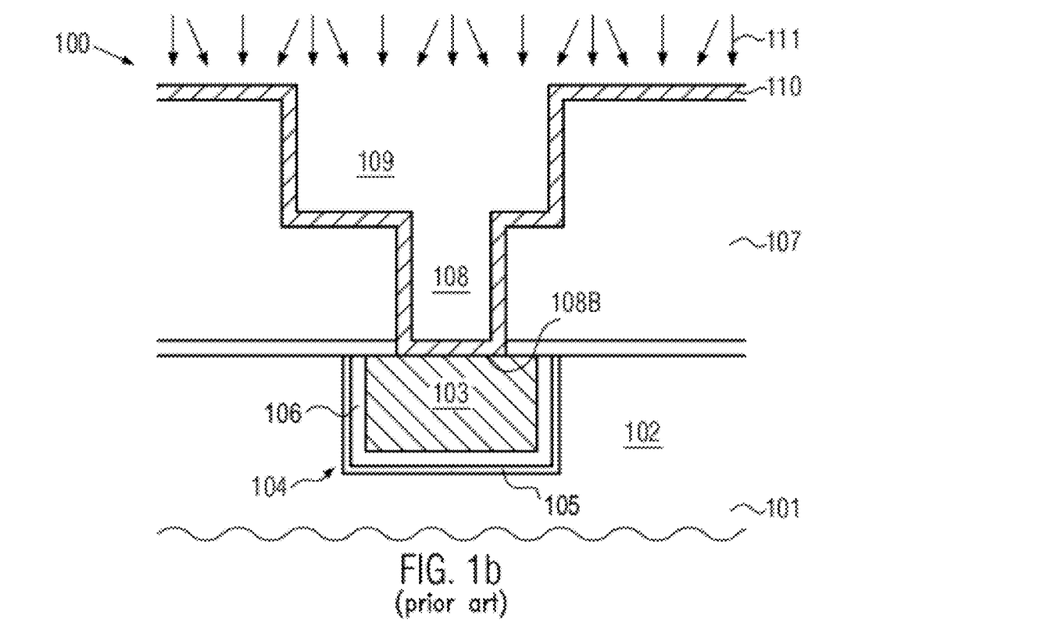

FIG. 1b schematically shows the metallization structure 100 during a second step of the ALD process 111, wherein a second gaseous ambient is established to form the tantalum nitride layer 110. For instance, activated nitrogen may be introduced to initiate the desired surface reaction on the basis of the pre-form 110A, wherein the reaction and thus the final layer thickness is determined by the pre-form 110A. Thus, a continuous coverage of the inner surfaces of the trench 109 and the via 108 is obtained in order to provide a reliable diffusion barrier, in particular at critical locations, such as the sidewalls of the via 108 and the trench 109. However, tantalum nitride exhibits a moderately high electrical resistance, which may result in an undue overall resistance of the via 108 after providing the tantalum material and filling the structure with a copper-based material. Therefore, prior to forming a second barrier layer on the basis of tantalum, the layer 110 is removed at the via bottom 108B. To this end, a sputter etch process is typically performed with a high degree of directionality.

Figure 1C:
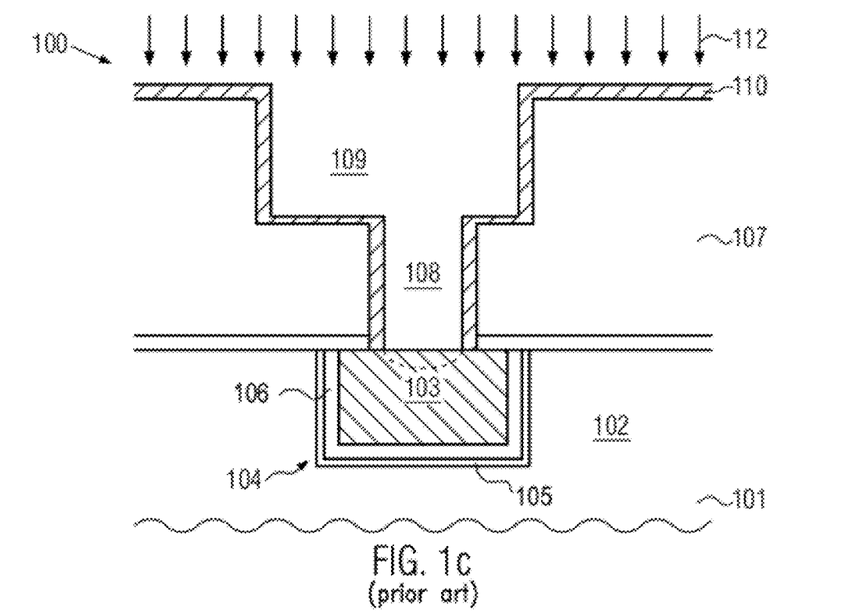

FIG. 1c schematically illustrates the metallization structure 100 during a corresponding sputter etch process 112 for opening the via bottom 108B. During the process 112, a corresponding material removal may also occur in other substantially horizontal portions, for instance in the trench 109, thereby also significantly affecting the highly sensitive low-k dielectric material 107. Moreover, during the aggressive re-sputtering 112 at the via bottom 108B, copper atoms may also be liberated into the etch ambient, which may deposit at undesired locations, thereby possibly resulting, in combination with the damaged low-k dielectric, in a reduced performance and possibly in a lower reliability of the finally obtained interconnect structure.

After the sputter etch process 112, tantalum may be deposited, for instance by sputter deposition, in order to provide the desired barrier and adhesion characteristics, as previously explained.

Figure 1D:
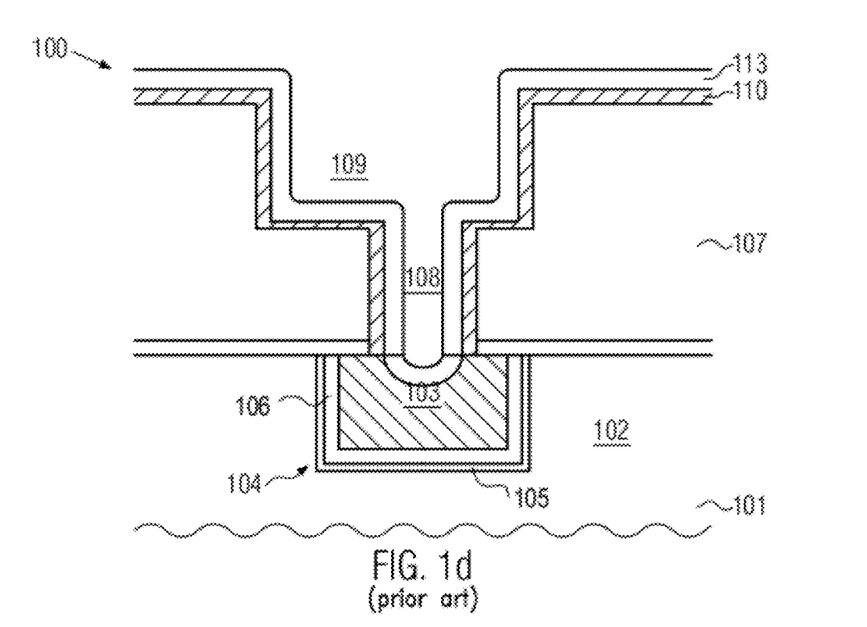

FIG. 1d schematically illustrates the metallization structure 100 with a second barrier layer 113 comprised of tantalum, wherein the layer 113 may extend into the metal line 103 due to the preceding sputter etch process 112. Similarly, the trench 109 may exhibit damaged areas which may result in respective line irregularities.

Consequently, although the ALD process of the tantalum nitride layer 110 may provide high reliability with respect to coverage of the critical via and trench sidewalls, the subsequent aggressive removal of the high resistance tantalum nitride material may cause damage in other sensitive device areas, thereby reducing performance and reliability of the interconnect structure, in particular when highly scaled semiconductor devices are considered.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for forming material layers by a self-limiting deposition technique such as atomic layer deposition (ALD) in order to take advantage of the high degree of conformality that may be obtained for the resulting material layer, even if provided with a very reduced layer thickness and on the basis of sophisticated surface topographies typically encountered during the fabrication of advanced semiconductor devices. On the other hand, the highly conformal deposition rate may be intentionally locally modified in order to obtain a certain degree of selectivity of the deposition process, thereby enabling the selective deposition of extremely thin yet continuous layer portions at specific device surfaces, while in other areas a respective reduced layer thickness may be obtained. The concept of a selective self-limiting deposition process may be advantageously applied to forming critical material layers, such as conductive barrier layers for advanced metallization structures, or any other sophisticated liner materials requiring a high selectivity between different exposed surface portions. Thus, in one illustrative embodiment, the selective self-limiting deposition process may be applied to forming conductive barrier layers, wherein the selectivity may be provided with respect to substantially horizontal and substantially vertical surface portions, thereby significantly reducing, for instance, the contact resistance between highly scaled vias and metal lines in respective metallization structures.

According to one illustrative embodiment disclosed herein, a method comprises selectively modifying surface characteristics of a first exposed surface and a second exposed surface of a device feature of a semiconductor device. Furthermore, the method comprises depositing a first material layer on the first and second surfaces of the device feature by a self-limiting deposition technique, wherein the modified surface characteristics result in a reduced deposition rate for the first exposed surface.

According to another illustrative embodiment disclosed herein, a method of forming a liner material on a device feature of a semiconductor device is provided. The method comprises providing an inhibitor material above a first surface of the device feature and depositing at least a first material layer of the liner material by a self-limiting deposition process. In this process, the inhibitor material provides a reduced deposition rate on the first surface compared to a deposition rate on a second surface of the device feature.

According to yet another illustrative embodiment disclosed herein, a method of forming a liner material on a device feature of a semiconductor device is provided, wherein the device feature has a first surface and a second surface. The method comprises providing a catalyst material above the second surface of the device feature and depositing at least a first material layer of the liner material by a self-limiting deposition process. During deposition, the catalyst material provides an increased deposition rate on the second surface compared to a deposition rate on the first surface of the device feature.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously explained, during the manufacturing sequence of sophisticated semiconductor devices, frequently sophisticated liner materials have to be formed on exposed surface portions, wherein the per se advantageous characteristics of self-limiting deposition processes are exploited to obtain an extremely conformal deposition behavior even for sophisticated device structures and extremely reduced critical dimensions. For example, frequently, device features are encountered during the complex manufacturing process flow in which substantially vertical and horizontal surface portions may be required, at least within certain areas of a respective device feature. For instance, semiconductor lines, such as gate electrodes and the like, may have substantially vertical sidewall portions and a substantially horizontal surface area, which may require different types of liner materials, depending on the process strategy. In this respect, it should be appreciated that any positional statements with respect to the orientation or position of certain components have to be understood as relative to a reference plane defined by a respective surface portion. For example, the terms "vertical," "horizontal," "lateral" and the like may generally be referred to the corresponding substrate material, in and above which may be formed the respective device features, wherein the corresponding substrate material is typically provided in a disk-like shape, at least during most of the manufacturing processes considered in this application. On the other hand, such terms as "above," "below" and the like may occasionally refer to a certain reference surface portion other than the substrate surface. For instance, a material layer may be formed "on" or "above" a surface portion, irrespective of whether the surface portion is substantially vertically oriented with respect to the substrate material. In particular, for any deposition processes, the respective deposition surface may act as a reference plane in order to precisely indicate the position at which a specific material is actually deposited.

Another important field for applying a selective self-limiting deposition process is the formation of advanced metallization structures, as is previously described with reference to FIGS. 1a-1d, since, in this case, a selective deposition or at least a significantly different layer thickness at various surfaces of respective via openings and/or trenches may be highly advantageous with respect to the overall performance and reliability of the resulting interconnect structure. It should, however, be understood that, although being highly advantageous in the context of metallization structures, the subject matter disclosed herein may be applied to any situation in which extremely thin layer portions have to be provided by a self-limiting deposition process, in which a high degree of conformality may have to be appropriately adapted to restricted surface portions according to the specific process and device requirements. Thus, unless specifically pointed out in the specification or the appended claims, the present invention should not be construed as being limited to the formation of metallization structures.

Figure 2A:
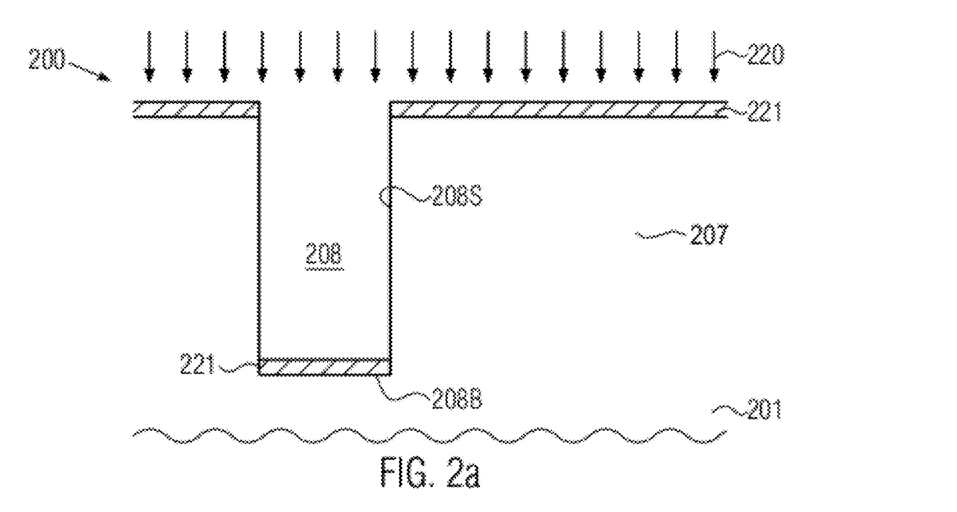
FIGS. 2a-2c schematically illustrate cross-sectional views of a semiconductor device including a device feature, on exposed surfaces of which a material layer is to be selectively formed on the basis of a self-limiting deposition process including a preceding step for providing an inhibitor material according to illustrative embodiments.

FIG. 2a schematically illustrates a cross-sectional view of a semiconductor device 200 that is formed on and above a corresponding substrate 201, which may represent any appropriate carrier material for forming respective semiconductor features. For instance, the substrate 201 may represent a semiconductor bulk substrate, a silicon-on-insulator (SOI) substrate and the like. In some illustrative embodiments, the substrate 201 may represent a silicon-based material, i.e., the substrate 201 may have formed thereabove a respective semiconductor layer comprising a significant amount of silicon, since the vast majority of complex integrated circuits, such as CPUs, high capacity storage chips and the like, are presently and will be in the foreseeable future manufactured on the basis of silicon. The semiconductor device 200 may comprise a layer of material 207, which may represent any appropriate material such as a dielectric material, a low-k dielectric material, a semiconductor material and the like. In one illustrative embodiment, the material layer 207 may represent a dielectric material, as will be explained in more detail later on with reference to FIGS. 3a-3d.

The semiconductor device 200 may comprise in this manufacturing stage a device feature 208, which, in the illustrative embodiment shown, may be represented as an opening having at least a first exposed surface 208B and a second exposed surface 208S. For example, the device feature 208 may represent a trench having a width, i.e., in FIG. 2a, the horizontal extension, in accordance with device requirements, wherein, in sophisticated applications, a respective trench width may be in the range of 200 nm and significantly less, or even 100 nm and less. In one illustrative embodiment, the first exposed surface 208B may represent a substantially horizontal surface, while the second exposed surface 208S may represent a substantially vertical surface corresponding to the above-given definition. In still other illustrative embodiments, the device feature 208 may represent any type of opening, such as a via-type opening having substantially similar dimensions in any lateral direction.

Furthermore, the semiconductor device 200 may comprise, in this manufacturing stage, a surface modification layer 221 which is configured to correspondingly modify the deposition rate with respect to a specified self-limiting deposition process, to be described later on. In the illustrative embodiments shown, the surface modification layer 221 may be provided on substantially horizontal surface portions, such as the first surface 208B, wherein, in one illustrative embodiment, the material 221 may provide a reduced deposition rate during a self-limiting process. In this case, a corresponding deposition on or above the first surface 208B may need to be less efficient due to process- and device-specific requirements. In other illustrative embodiments, the surface modification layer 221 may represent a deposition enhancing material when a reduced deposition rate may be desired on the second surface 208S. It should be appreciated that the surface modification layer 221 may be comprised of any appropriate material providing the required surface modification characteristics and having the required compatibility with the subsequent process conditions. For instance, the surface modification layer 221 may act as a deposition inhibiting material when a significantly reduced degree of deposition is required, at least above the first surface 208B. In this case, any appropriate materials may be used for the layer 221, which may result in a reduced adhesion of a respective pre-form during a corresponding self-limiting deposition process, as will be described later on in more detail. For instance silicon carbide, possibly in combination with hydrogen, may significantly reduce the degree of adhesion during a self-limiting process for depositing tantalum nitride, according to an ALD process as previously described with reference to FIGS. 1a-1d. Other appropriate materials may include respective polymer species, which may significantly change the local deposition conditions during the self-limiting process. In other illustrative embodiments, the layer 221, when representing a deposition inhibiting material, may comprise appropriate metal-containing materials as long as a required process compatibility and the deposition inhibiting characteristic may be guaranteed. It should be appreciated that a thickness of the surface modification layer 221 may be selected moderately low, since the subsequent self-limiting deposition process may substantially depend on the surface characteristics, and thus even extremely minute amounts of "interfering" particles may suffice for significantly modifying the deposition kinetics at the deposition surface. Hence, an appropriate thickness may range from several nanometers and significantly less, such as 1 nm and less.

The semiconductor device 200 as shown in FIG. 2a may be formed on the basis of the following processes. After providing the substrate 201 and forming the material layer 207, any appropriate patterning processes, which may include, for instance, advanced lithography techniques, anisotropic etch processes and the like, may be performed corresponding to the device requirements. For instance, the device feature 208, when provided in the form of an opening, may be formed on the basis of appropriately designed masking regimes in combination with advanced anisotropic etch techniques, thereby providing the surfaces 208S, 208B as shown. Next, a process 220 may be performed for providing the modification layer 221, wherein, in one illustrative embodiment, the process 220 comprises a highly anisotropic deposition process in order to provide the desired degree of selectivity for covering the first surface 208B while substantially maintaining the surface 208S non-covered. For example, respective deposition techniques with a high degree of directionality may be performed on the basis of ionized physical vapor deposition processes and the like. Corresponding process recipes are well established for a plurality of materials and may be used. Similarly, certain PECVD processes may also exhibit a high degree of non-conformality and may also be advantageously used in the context of the subject matter disclosed herein. For example, a plurality of dielectric materials, which may be efficiently used as deposition inhibiting materials may be deposited with a high degree of non-conformality, wherein the degree of non-conformality may even be enhanced by performing a subsequent isotropic and highly selective etch process, during which the surface 208S may be substantially exposed, while nevertheless a certain degree of material may remain on the first surface 208B.

In other illustrative embodiments, the process 220 may comprise a treatment by plasma, ion implantation and the like, in which a high degree of directionality may be achieved in order to appropriately define the respective surface characteristics for the subsequent self-limiting deposition process. For instance, if the layer 221 may represent a catalyst material for increasing the respective deposition rate, an appropriate catalyst species may be incorporated into the respective exposed surface portions with a high degree of directionality when an increased deposition rate may be desired above the bottom surface 208B. In other cases, during a correspondingly designed plasma treatment, appropriate materials such as polymer materials may be incorporated into the respective surface portion so as to act as an efficient inhibitor material during the subsequent self-limiting process.

Figure 2B:
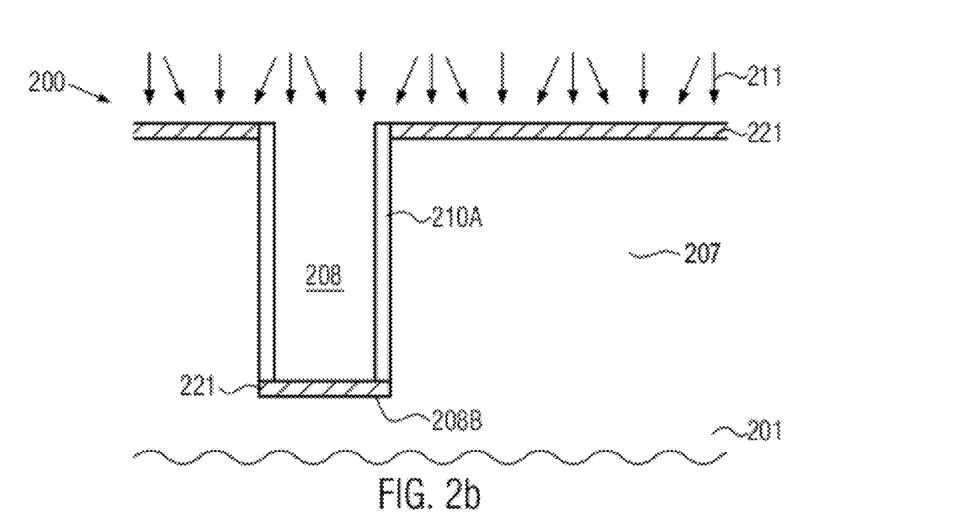

FIG. 2b schematically illustrates the semiconductor device 200 during a first step of a self-limiting deposition process 211. In the illustrative embodiment shown, the layer 221 may efficiently reduce the corresponding deposition rate for a pre-form 210A on the surface 208B, while providing reliable and continuous coverage of the surface 208S.

Figure 2C:
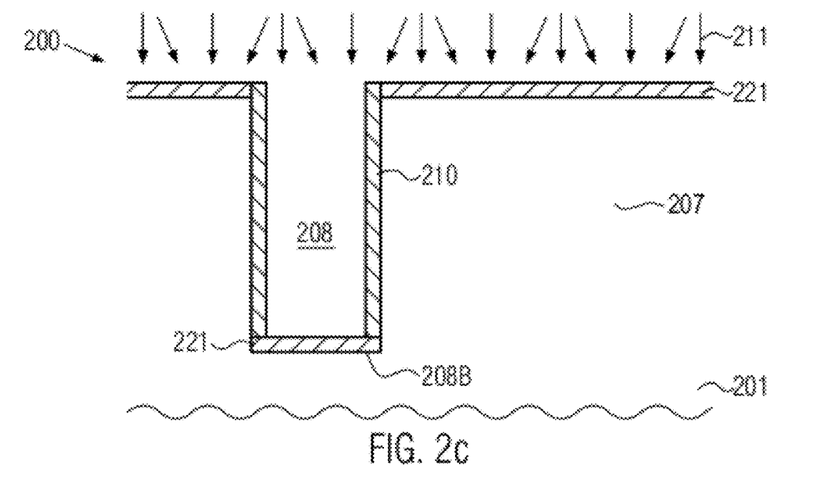

FIG. 2c schematically illustrates the semiconductor device 200 during a second step of the self-limiting deposition process 211, wherein the pre-form 210A may be efficiently converted into the desired material layer 210, which may represent any appropriate liner material, such as a conductive barrier layer and the like. During the second step of the process 211, the material 221 may also reduce any interaction of the gaseous ambient of the second step of the process 211, thereby providing a high degree of integrity of any material located below the opening 208. Consequently, the material 210 may be locally provided with the desired characteristics in view of layer thickness, coverage and the like, that is, the surface 208S may be reliably covered by the material layer 210 while at the same time providing a high degree of selectivity with respect to the bottom surface 208B. Hence, the advantages of the highly conformal deposition behavior of the process 211 may be used in combination with a reliable coverage of critical surface areas, such as the sidewall surface 208S, while nevertheless substantially avoiding a deposition or at least significantly reducing the degree of deposition on and above the surface 208B.

Figure 2D:
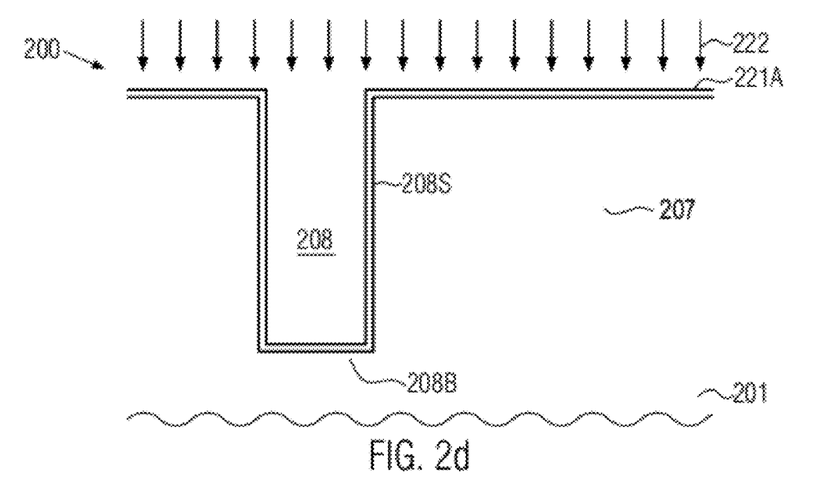
FIGS. 2d-2f schematically illustrate cross-sectional views of a device feature selectively receiving a material layer on the basis of a self-limiting process using a selectively applied catalyst material according to further illustrative embodiments.

FIG. 2d schematically illustrates the semiconductor device 200 according to a further illustrative embodiment. Here, the device feature 208 may also represent an opening, which may require a reliable coverage of the sidewall portion 208S, while having a significantly reduced amount of material on and above the surface 208B. In the manufacturing stage shown, the semiconductor device 200 may further comprise a modification layer 221A, which may be formed on exposed surfaces of the device 200. For instance, the modification layer 221A may comprise any appropriate catalyst material for providing an increased deposition rate with respect to the self-limiting process 211. Respective appropriate materials may be selected on the basis of the characteristics of the process 211 and depending on the device and process requirements. For instance, a plurality of metal materials, such as palladium, platinum and the like, are known to provide enhanced deposition characteristics for some of the well-established self-limiting deposition processes, such as the process 211. In some illustrative embodiments, the modification layer 221A may be formed with a low layer thickness in order to maintain the effects of a corresponding anisotropic patterning process 222 at a low level with respect to material integrity, for instance at the surface 208B. For instance, in some illustrative embodiments, the modification layer 221A may be formed on the basis of a deposition process providing a high degree of conformality, such as a self-limiting process, a chemical vapor deposition process and the like, wherein the degree of coverage may not be critical, since a continuous coverage may not be necessary for catalyzing the subsequent process 211. In one illustrative embodiment, the modification layer 221A may represent a portion of the material to be formed on the sidewall 208S, however with a significantly reduced layer thickness. Hence, in this case, the modification layer 221A may be formed on the basis of the self-limiting deposition process 211, as will also be described in more detail later on. Hence, in some cases, a layer thickness of 1 nm and significantly less may be appropriate for the layer 221A in order to appropriately enhance the respective deposition characteristics in the subsequent deposition process. After the deposition of the layer 221A, the patterning process 222 may be performed, for instance in the form of a highly anisotropic etch process in order to selectively remove material of the layer 221A from horizontally oriented surface portions, such as the surface 208B. It should be appreciated that respective highly anisotropic etch conditions may be readily established on the basis of well-approved techniques, for instance by establishing a respective plasma ambient and/or adding appropriate polymer materials which may significantly reduce the lateral etch rate compared to the vertical etch rate. Due to the moderately low layer thickness of the layer 221A, a corresponding etch damage that may possibly be caused by the process 222 may not unduly affect the characteristics of the surface 208B, which may be substantially completely exposed during the patterning process 222.

Figure 2E:
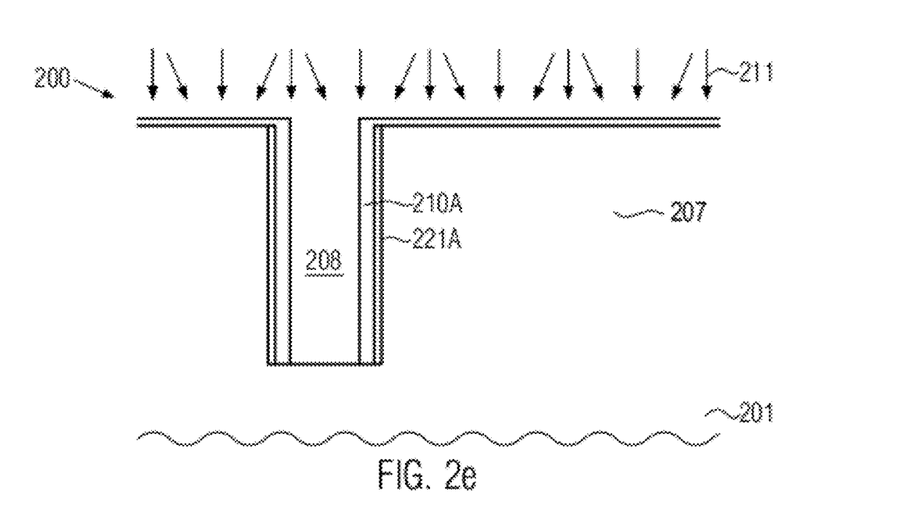

FIG. 2e schematically illustrates the semiconductor device 200 after removing unwanted portions of the layer 221A and during a first step of the self-limiting process 211, thereby depositing the pre-form 210A with high selectivity due to the presence of the deposition enhancing material on the sidewall surface 208S. It should be appreciated that, typically, the self-limiting process 211 may be performed in a plurality of cycles, of which each comprises the first and the second step to obtain the finally required layer thickness of the corresponding liner material. Hence, in a first step of the self-saturating process 211, a significantly increased thickness may result at the surface 208S, which may then be efficiently converted into the desired material composition in a subsequent step. Thus, as long as exposed portions of the surface 208B are not sufficiently covered by the pre-form 210A so as to initiate a self-catalyzing effect, any subsequent step of the process 211 may also result in a reduced layer thickness at the surface 208B, although the initial effect of the modification layer 221A may no longer be effective. Hence, in some illustrative embodiments, the corresponding process 211 may be designed such that a significant layer thickness may be obtained within a moderately low number of process cycles, thereby taking advantage of the significantly enhanced deposition rate on the material 221A compared to the surface 208B.

Figure 2F:
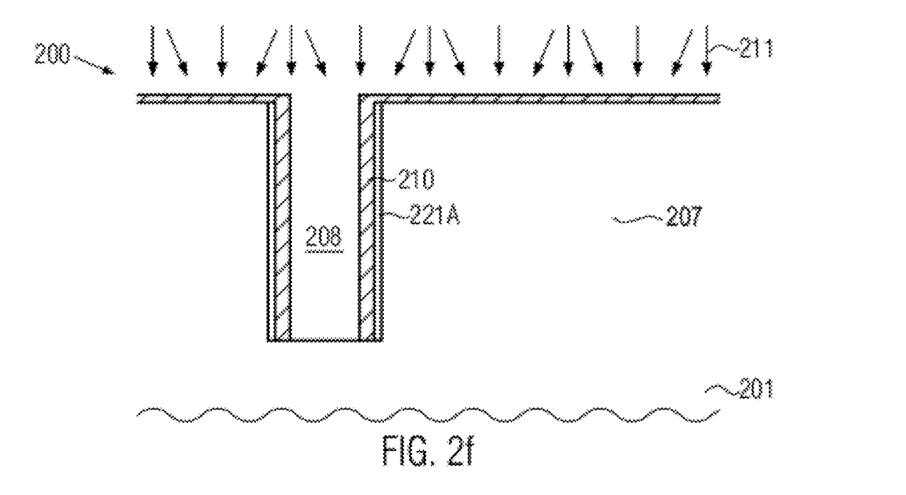

FIG. 2f schematically illustrates the semiconductor device 200 during the second step, i.e., one of the second steps if a plurality of process cycles are considered, in order to convert the pre-form 210A into the desired material composition to obtain the required liner material 210.

Also, in these embodiments, a high degree of selectivity of the deposition process 211 may be obtained on the basis of the layer 221A, wherein the availability of appropriate catalyst materials may provide a high degree of process flexibility.

Figure 2G:
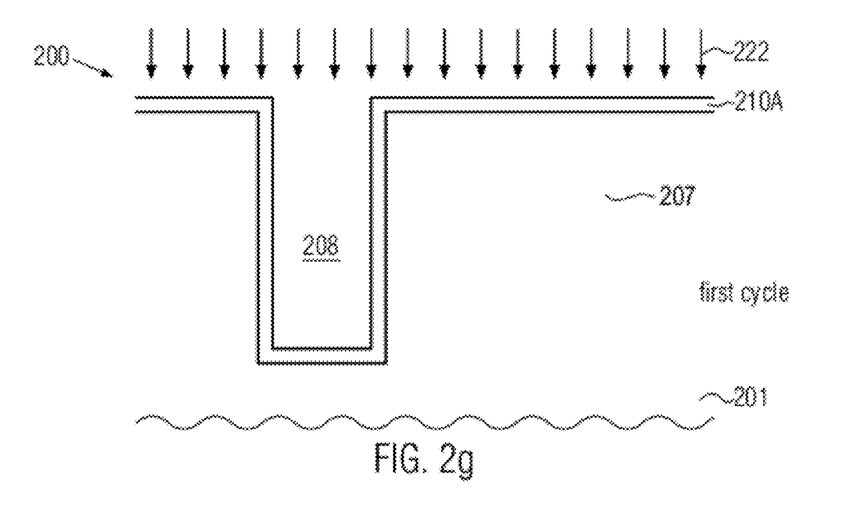
FIGS. 2g-2i schematically illustrate cross-sectional views of a device feature during different steps of a self-limiting deposition process, wherein exposed surfaces are intermittently modified to obtain different layer thicknesses according to yet other illustrative embodiments.
Figure 2H:
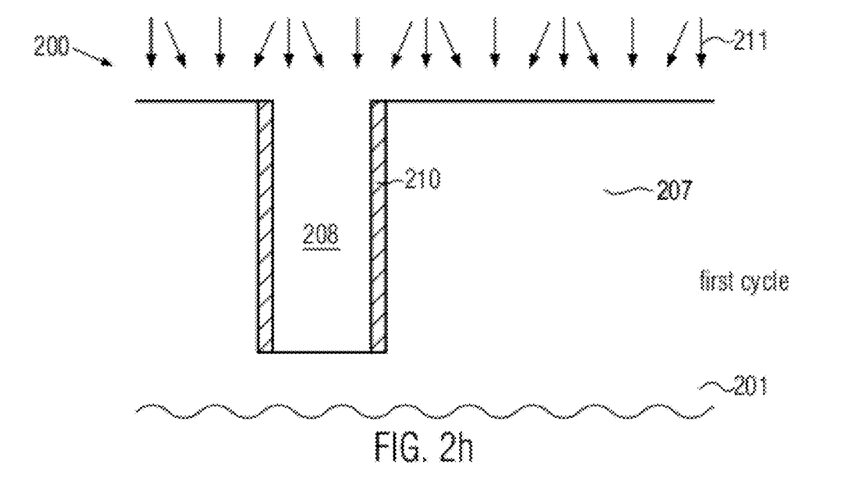
Figure 2I:
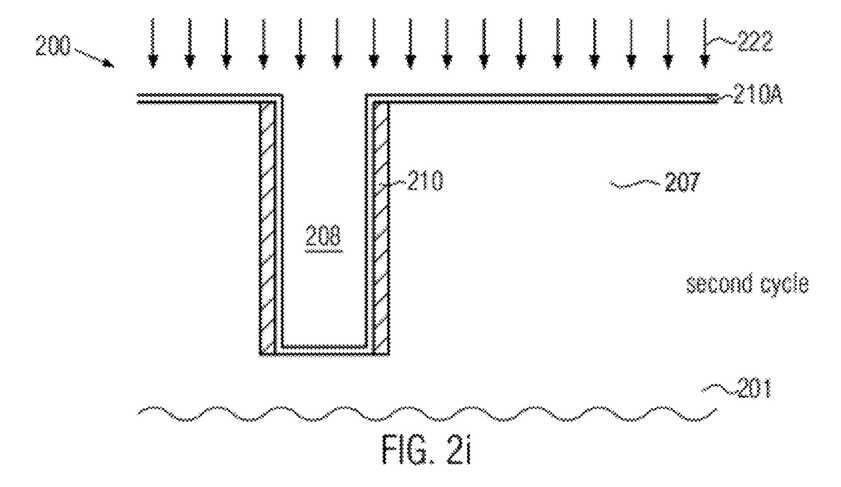

With reference to FIGS. 2g-2i, further illustrative embodiments will now be described in which the corresponding selectivity may be provided within different cycles or steps of the self-limiting deposition process.

FIG. 2g schematically illustrates the semiconductor device 200 during a specified cycle, for instance a first cycle, having resulted in the deposition of a very thin layer of the pre-form material 210A. That is, a gaseous ambient may have been established in order to form the layer 210A in a self-limiting manner, wherein, in some illustrative embodiments, the resulting layer thickness 210A may be adjusted to approximately 1 nm and significantly less in order to provide high efficiency of a subsequent patterning process 222. The process 222 may represent a highly anisotropic treatment in order to preferably remove material from the surface 208B, while substantially maintaining the initially created layer thickness at the surface 208S. For this purpose, respective appropriate anisotropic etch recipes may be used, while, in some illustrative embodiments, the process 222 may be performed as an in situ process with respect to the first and second steps of the self-limiting process 211. For example, an appropriate plasma ambient may be established, thereby providing a high degree of directionality, wherein, due to the reduced layer thickness of the pre-form 210A, extremely short exposure times may be sufficient for creating a respective anisotropic material removal.

FIG. 2h schematically illustrates the semiconductor device 200 during the first cycle, however during the second step of the process 211 so as to convert the pre-form 210A into the finally desired material composition of the liner material 210. Due to the preceding anisotropic treatment 222, a high degree of selectivity between the surfaces 208S and 208B may be obtained during the first cycle of the process 211.

FIG. 2i schematically illustrates the semiconductor device 200 during a second cycle of the process 211, i.e., after forming a further pre-form 210A, which may also be treated on the basis of the process 222, as previously described, in order to provide the desired selectivity in the subsequent second step of the second cycle. Hence, each cycle or a plurality of cycles of the self-limiting process 211 may receive a specified selectivity with respect to the surfaces 210S, 210B due to the treatment 222, thereby increasingly forming the desired layer thickness at the surface 208S, while obtaining a significantly reduced thickness or a substantially exposed surface at 208B. It should be appreciated that the corresponding process 222 for generating the desired degree of selectivity may not necessarily be performed after each cycle, but may be performed at dedicated points of the respective process flow in order to obtain the desired degree of thickness difference of the surfaces 208B, 208S. Furthermore, since the anisotropic modification process 222 may act on a very thin pre-form material layer 210A, the corresponding process conditions may be selected so as to obtain a moderately low impact on the surface 208B. In this case, even a repeated application of the anisotropic process 222 may result in a moderately low etch damage, thereby maintaining a high degree of integrity of the surface 208B. In other illustrative embodiments, the corresponding anisotropic treatment 222 may be performed on the basis of a certain layer thickness at the bottom 208B, which may not completely be removed so as to further reduce any effects on the surface 208B.

Consequently, the illustrative embodiments described so far may provide a high degree of selectivity during a self-limiting deposition process, which per se may exhibit high conformality, thereby providing an appropriate technique for forming reliable liner materials with a high degree of selectivity on exposed surfaces of device features. It should also be appreciated that the device feature 208, shown in the form of an opening, may, in other illustrative embodiments, be represented by a corresponding feature protruding from the layer 207, for instance in order to selectively provide an appropriate liner material on the respective sidewall areas thereof. As previously explained, the formation of extremely thin conductive barrier materials may be an important aspect for the further scaling of advanced semiconductor devices, since, in the metallization level, typically highly diffusive metals, such as copper and the like, may have to be reliably confined even in features having a high aspect ratio, such as trenches and vias of advanced metallization structures. Thus, providing a selective yet highly conformal deposition technique may represent an efficient technique for future device generations.

With reference to FIGS. 3a-3d, further illustrative embodiments will now be described, in which the selective self-limiting deposition process may be used for forming respective barrier layers, such as tantalum nitride/tantalum-based layers, wherein the deposition of a respective barrier material at the bottom of a via may be efficiently suppressed in order to obtain enhanced performance of the respective interconnect structure compared to conventional structures, as previously described with reference to FIGS. 1a-1d.

Figure 3A:
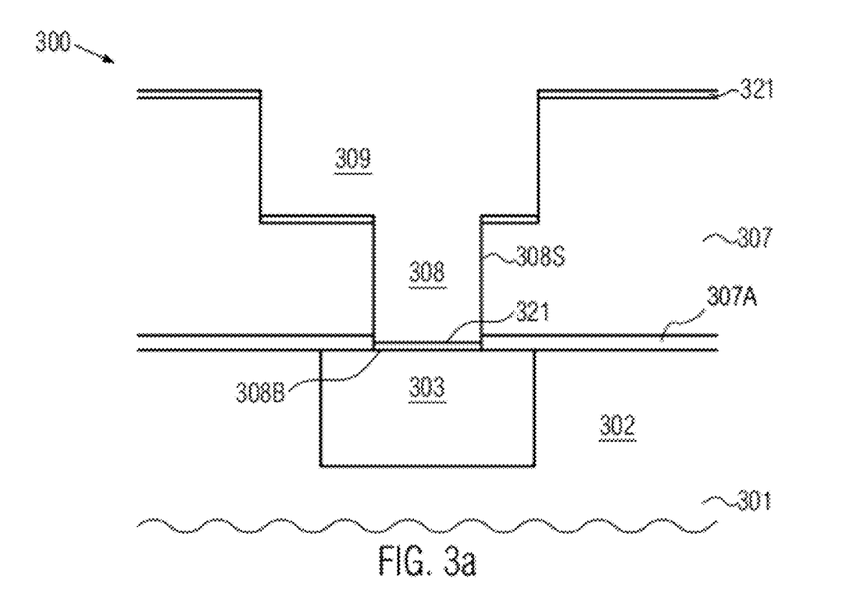
FIGS. 3a-3d schematically illustrate cross-sectional views of a device feature of a metallization structure during various manufacturing stages for forming a barrier layer on the basis of a self-limiting deposition process, wherein the deposition rate is different for substantially vertical and horizontal surface portions according to further illustrative embodiments.

In FIG. 3a, a semiconductor device 300 may comprise a substrate 301 having formed thereon a dielectric layer 302 comprising a metal region 303. For example, the layer 302, in combination with the metal region 303, may represent a metallization layer of the device 300, similarly as is described with reference to FIG. 1a for the device 100. A dielectric layer 307, which may comprise an etch stop layer 307A, may be formed above the layer 302 and the metal region 303, wherein, in sophisticated applications, the dielectric layer 307 may comprise a low-k dielectric material which may be understood as a dielectric material having a relative permittivity of 3.0 or significantly less. The layer 307 may have formed therein an appropriate opening wherein, for convenience, in this illustrative embodiment, a respective trench 309 may be formed in combination with a via opening 308 that is connected to the metal region 303. It should be appreciated that the embodiment shown is of illustrative nature only, and any other appropriate configuration as required for advanced metallization structures may be contemplated by the subject matter disclosed herein. Furthermore, during the manufacturing stage shown in FIG. 3a, a surface modification layer 321 may be provided, for instance in the form of a deposition inhibiting material, as previously explained. As shown, the material of the layer 321 may be selectively provided on horizontal surface portions of the device 300. Hence, the material of the layer 321 may also be present at the surface 308B, while material of the layer 321 may substantially not be present on the sidewall surface 308S or may at least be provided thereon with a significantly reduced concentration compared to the bottom surface 308B. As previously explained, the layer 321 may be formed by an anisotropic treatment, such as a deposition process with a high degree of directionality, a combined deposition and patterning process and the like. In some illustrative embodiments, the material 321 is provided by a highly non-conformal deposition technique on the basis of moderately adjusted parameters with respect to ion bombardment, thereby maintaining a surface degradation of the surface 308B at a moderately low level, while similarly sensitive device areas within the material 307 may also remain in a state of high integrity. Next, the device 300 may be subjected to a self-limiting deposition process, as previously described with reference to the process 211 or 111, wherein, in one illustrative embodiment, the corresponding process may be designed so as to deposit a conductive barrier material appropriate for copper-based metallization structures. Hence, in one illustrative embodiment, the respective self-limiting deposition process is performed so as to deposit tantalum nitride, for instance based on respective deposition recipes as previously described with reference to the device 100. During the deposition, the layer 321 provides a high degree of selectivity with respect to the resulting deposition rate, thereby substantially reducing or completely avoiding a deposition above the surface 308B.

Figure 3B:
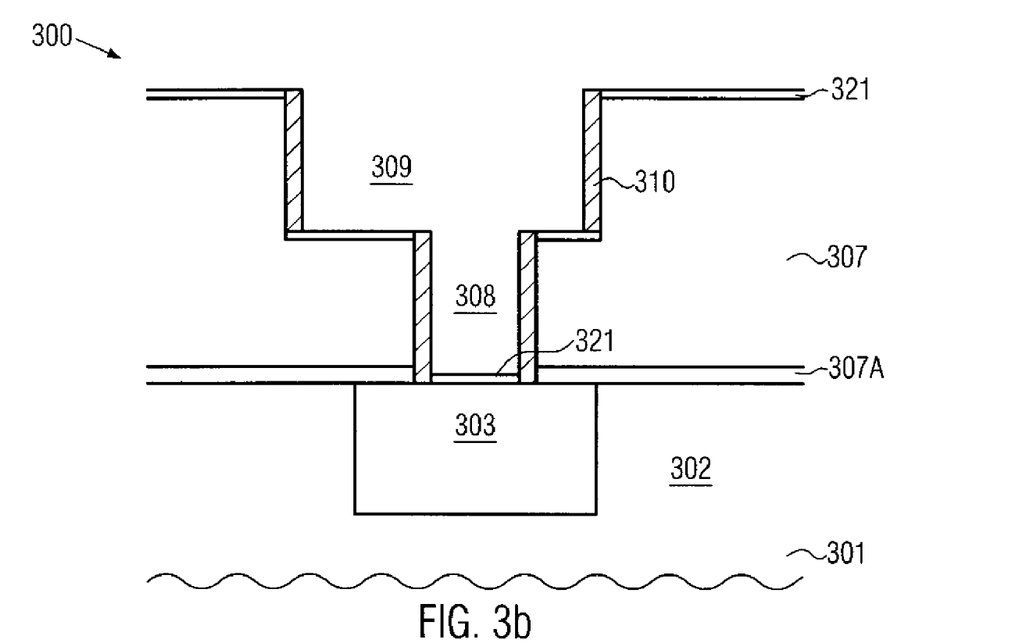

FIG. 3b schematically illustrates the device 300 with a selectively formed material layer 310, which may represent an efficient barrier layer if copper-based metallization structures are considered. Thus, critical sidewall portions of the trench 309 and the sidewall of the via opening 308, indicated as 308S, may be reliably covered while efficiently reducing the amount of barrier material above the bottom 308B, thereby providing enhanced performance with respect to overall conductivity, as is previously explained.

Figure 3C:
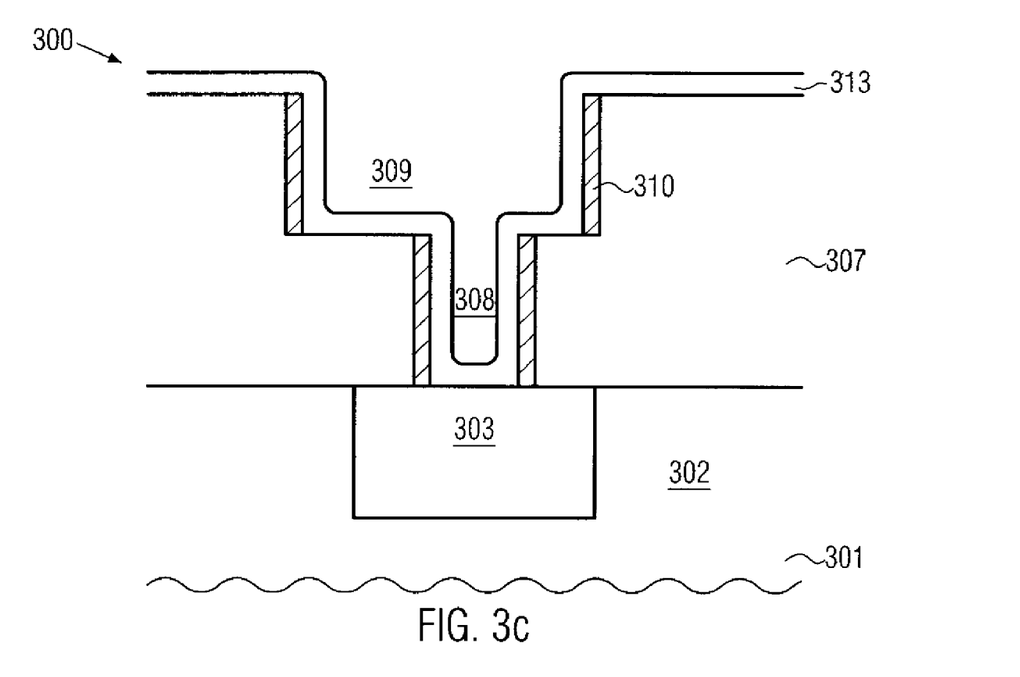

FIG. 3c schematically illustrates the semiconductor device 300 in a further advanced manufacturing stage, wherein a second barrier layer 313 may be formed above the first layer 310 and above horizontal surface portions, such as the surface 308B. The second barrier layer 313 may, in combination with the layer 310, provide the desired barrier characteristics, i.e., a high degree of diffusion blocking effect in combination with superior adhesion characteristics. In one illustrative embodiment, the barrier layer 313 may be comprised of tantalum, which may exhibit a moderately high adhesion to copper and may also efficiently suppress copper diffusion into the neighboring dielectric materials. The barrier layer 313 may be formed on the basis of well-established techniques, such as CVD, sputter-deposition and the like, wherein a reliable coverage of the critical sidewall portions may be of less concern due to the reliable coverage by the first barrier layer 310. Furthermore, during the deposition of the second barrier layer 313, a respective pre-cleaning process may be performed in order to efficiently remove residues of the layer 321 and/or other contaminants, which may be accomplished, for instance, on the basis of a mild sputter process performed during an initial phase of the deposition process for forming the layer 313. However, compared to the conventional strategy as previously described, undue damage of sensitive device areas, such as the dielectric material 307, if provided as a low-k dielectric material, may be substantially avoided or at least significantly reduced, since the corresponding inhibitor material of the layer 321 may have a significantly reduced thickness and may also be selected to exhibit a high degree of volatility during the corresponding sputter etch process. Hence, the corresponding process parameters for removing contaminants of the material 321 may be selected so as to not unduly affect the exposed surface 308B and/or other sensitive areas. In still other illustrative embodiments, any residues of the layer 321 may be removed by any appropriately designed cleaning process, such as a wet chemical process having a high degree of selectivity with respect to the material of the layer 307, thereby further reducing any undue impact on sensitive device areas. In this case, a corresponding aggressive sputter-etch process may even be omitted, thereby providing for even further enhanced performance and reliability.

Thereafter the further processing may be continued, for instance by the deposition of a seed layer, which may represent any appropriate material, such as copper, copper aluminum, and the like, which may provide the desired process conditions during a subsequent electrochemical deposition of a metal, such as copper, copper alloys, silver and the like.

Figure 3D:
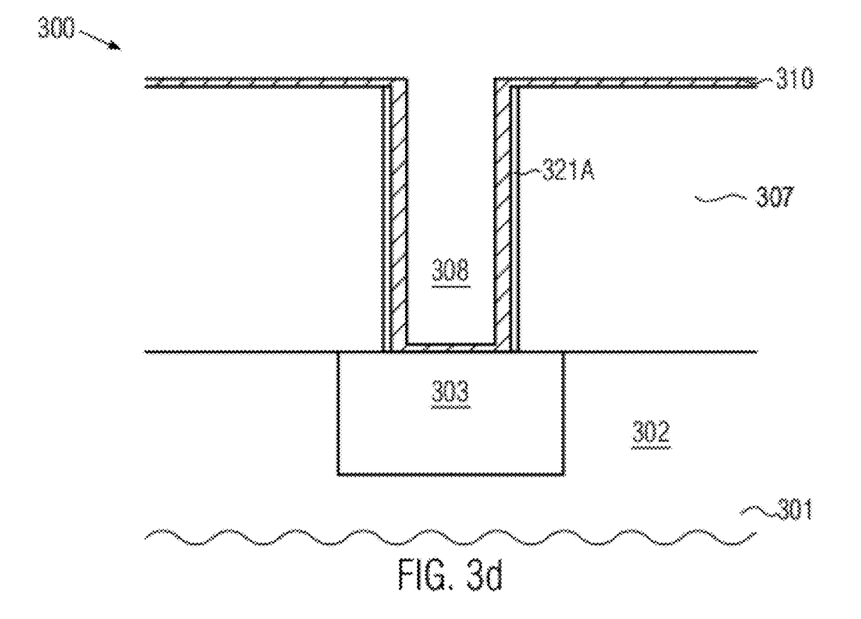

FIG. 3d schematically illustrates the semiconductor device 300 according to further illustrative embodiments, wherein the opening 308, which may represent a trench, a via opening and the like, may have formed on sidewalls thereof an appropriate catalyst material 321A so as to promote the deposition on the substantially vertical surface 308S, while significantly reducing the corresponding material deposition above the surface 308B. The corresponding catalyst layer 321A may be formed on the basis of any appropriate process technique, as is also for instance described with reference to FIGS. 2d-2f. Thus, also in this case, a high degree of selectivity during the deposition of material in a self-limiting deposition process may be achieved.

As a result, the subject matter disclosed herein provides a technique for combining the advantages of a self-limiting deposition process, i.e., a highly controllable generation of a layer thickness even at very critical device areas, such as the sidewalls of via openings, and the selectivity of a highly non-conformal deposition process. Consequently, by combining these two concepts, reliable liner materials may be formed on respective device features with high selectivity while not unduly contributing to process complexity. The high degree of selectivity of the per se highly conformal self-limiting deposition process may be accomplished on the basis of a respective selective surface modification of the corresponding device feature, for instance by providing an inhibitor material, a catalyst material or by anisotropically treating exposed surface portions in order to correspondingly affect the deposition behavior during the subsequent self-limiting process. The high selectivity offered by the self-limiting process according to the subject matter disclosed herein may, in some illustrative embodiments, be advantageously used for forming appropriate barrier layers in advanced metallization structures, wherein the deposition of the respective barrier material may be suppressed or at least significantly reduced at respective surface portions, such as the bottom surface of a via.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an opening in a metallization structure of a semiconductor device, said opening comprising a substantially horizontal surface and a substantially vertical surface;
   forming an inhibitor material above said substantially horizontal surface of said opening, wherein forming said inhibitor material comprises performing a directional deposition process having a main deposition direction that is substantially perpendicular to said substantially horizontal surface; and
   after forming said inhibitor material, forming a first layer of a liner material inside of said opening, wherein forming said first layer of said liner material comprises performing a self-limiting deposition process, and wherein said inhibitor material provides a reduced deposition rate on said substantially horizontal surface as compared to a deposition rate on said substantially vertical surface.

2. The method of claim 1, wherein performing said directional deposition process comprises performing an ionized physical vapor deposition process.

3. The method of claim 1, wherein performing said self-limiting deposition process comprises performing an atomic layer deposition process.

4. The method of claim 1, wherein forming said opening comprises forming a via opening.

5. The method of claim 1, wherein forming said opening comprises forming a trench opening.

6. The method of claim 1, wherein forming said first layer of said liner material inside of said opening comprises depositing a material layer comprising tantalum nitride.

7. The method of claim 1, further comprising forming a second layer of said liner material inside of said opening after forming said first layer of said liner material.

8. The method of claim 7, wherein depositing said second layer of said liner material inside of said opening comprises depositing said second layer above said substantially horizontal surface and adjacent to said substantially vertical surface.

9. The method of claim 7, wherein forming at least one of said first and second layers of said liner material comprises depositing a material layer comprising tantalum.

10. The method of claim 7, wherein forming said second layer of said liner material comprises depositing a material layer comprising tantalum.

11. The method of claim 1, wherein forming said first layer of said liner material inside of said opening comprises forming a substantially vertical portion of said first layer adjacent to said substantially vertical surface, said substantially vertical portion having a thickness of approximately 5 nm or less.

* * * * *